US010727153B2

(12) United States Patent
Viswanathan et al.

(10) Patent No.: US 10,727,153 B2
(45) Date of Patent: Jul. 28, 2020

(54) THICK-SILVER LAYER INTERFACE

(71) Applicant: NXP USA, Inc., Austin, TX (US)

(72) Inventors: Lakshminarayan Viswanathan, Phoenix, AZ (US); Jaynal A Molla, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/608,660

(22) Filed: May 30, 2017

(65) Prior Publication Data

US 2017/0263529 A1 Sep. 14, 2017

Related U.S. Application Data

(62) Division of application No. 14/530,285, filed on Oct. 31, 2014, now Pat. No. 9,698,116.

(51) Int. Cl.

*H01L 21/48* (2006.01)
*H01L 23/373* (2006.01)
*H01L 23/367* (2006.01)
*H01L 23/00* (2006.01)

(52) U.S. Cl.

CPC ........ *H01L 23/3736* (2013.01); *H01L 23/367* (2013.01); *H01L 23/3735* (2013.01); *H01L 24/29* (2013.01); *H01L 24/32* (2013.01); *H01L 24/83* (2013.01); *H01L 2224/04026* (2013.01); *H01L 2224/05568* (2013.01); *H01L 2224/05644* (2013.01); *H01L 2224/2919* (2013.01); *H01L 2224/29083* (2013.01); *H01L 2224/29111* (2013.01); *H01L 2224/29139* (2013.01); *H01L 2224/29144* (2013.01); *H01L 2224/32245* (2013.01); *H01L 2224/8384* (2013.01); *H01L 2224/8385* (2013.01); *H01L 2224/83192* (2013.01); *H01L 2224/83439* (2013.01)

(58) Field of Classification Search

CPC ............... H01L 23/367; H01L 23/3736; H01L 23/3735; H01L 24/29; H01L 2224/29111; H01L 2224/29144; H01L 2224/29139; H01L 2224/29083

See application file for complete search history.

(56) References Cited

U.S. PATENT DOCUMENTS 9,768,037 B2 * 9/2017 Palm .................... H01L 23/538
2009/0108437 A1 * 4/2009 Raymond ............ H01L 23/373 257/713
2010/0246152 A1 * 9/2010 Lin ...................... H01L 21/563 361/783
2015/0123253 A1 * 5/2015 Hwang .................. H01L 24/29 257/676
2015/0124152 A1 * 5/2015 Bak ........................ C09B 57/10 348/340

* cited by examiner

*Primary Examiner* — Hoa B Trinh
(74) *Attorney, Agent, or Firm* — Sherry W. Schumm

(57) ABSTRACT

A semiconductor device and a method of manufacturing the same include a die and a planar thermal layer, and a thick-silver layer having a thickness of at least four (4) micrometers disposed directly onto a first planar side of the planar thermal layer, as well as a metallurgical die-attach disposed between the thick-silver layer and the die, the metallurgical die-attach directly contacting the thick-silver layer.

19 Claims, 4 Drawing Sheets

102
106
108
110
104
112
100

402
404
406
400

DISPOSE A THICK-SILVER LAYER DIRECTLY ONTO A FIRST PLANAR SIDE OF THE PLANAR THERMAL LAYER

THE THICK-SILVER LAYER HAVING A THICKNESS OF AT LEAST 4 MICROMETERS

DISPOSE A METALLURGICAL DIE-ATTACH BETWEEN THE THICK-SILVER LAYER AND THE DIE, THE METALLURGICAL DIE-ATTACH DIRECTLY CONTACTING THE THICK-SILVER LAYER

THICK-SILVER LAYER INTERFACE

CROSS-REFERENCE TO RELATED APPLICATION

This application is a divisional of co-pending, U.S. patent application Ser. No. 14/530,285, filed on Oct. 31, 2014.

FIELD OF THE INVENTION

The present invention generally relates to semiconductors, and, more specifically, to semiconductor devices and corresponding methods for an interface between a semiconductor die and a thermal layer.

BACKGROUND OF THE INVENTION

Semiconductor devices, such as integrated circuits or microcircuits, are widely used in modern electronic applications. Often, semiconductor devices generate relatively high amounts of heat due to the current passing through various devices and circuits within the semiconductor devices. For example, in power-supply applications and Radio Frequency (RF) applications, semiconductor devices can pass a larger amount of current or operate at higher frequencies (often with frequencies in the multiple gigahertz), both of which result in a higher heat load. If this heat is not dissipated from the die, the semiconductor device can begin to experience errors and/or failure. With adequate heat dissipation, semiconductor devices can often operate with a higher current load, higher operating frequency, and, potentially, a longer anticipated lifespan. Thus, optimal heat dissipation is often a concern in the design and packaging of semiconductor devices, as well as the design of the actual integrated circuit die.

Presently, it is common to couple an integrated circuit die to one or more thermal layers, flanges, or structures within the device packaging of a semiconductor device. This thermal layer, flange, or structure dissipates heat away from the integrated circuit die (the primary source of the heat) toward surrounding air or another thermally-coupled structure (for example, a dedicated heat-sink or a frame or chassis of a larger device into which the semiconductor device is integrated). The thermal conductivity of the material used to construct the thermal layer has a direct impact on the ability of the thermal layer to dissipate the heat. For example, a material with a higher thermal conductivity may be better suited to communicate heat away from the integrated circuit die than would a material with a lower thermal conductivity.

However, there are other often competing concerns or factors to consider when selecting the material used for a thermal layer, flange, or structure (or of other portions of a semiconductor device). One such factor is the coefficient of thermal expansion (CTE) of the respective materials used within a semiconductor device. CTE represents the physical amount of expansion or contraction a material will experience as the material heats up or cools down, respectively. More particularly, a factor in the design of semiconductor devices is the variance of CTEs amongst various materials used within a semiconductor device. A greater disparity in CTEs of coupled materials can result in greater physical stresses within the semiconductor device particularly as it heats up. The stresses are the result of one material physically expanding more than another material, which stresses can cause joints to break or materials to crack.

DETAILED DESCRIPTION OF THE PREFERRED EMBODIMENT

The present invention overcomes the aforementioned drawbacks by providing a semiconductor device and corresponding method of manufacturing a semiconductor device that utilizes a thick-silver layer between a thermal layer and a semiconductor die. The thick-silver layer can accommodate high CTE-mismatches between the thermal layer and a semiconductor die and/or a corresponding die-attach. Various embodiments described herein may reduce the need for multiple layers of different materials (e.g., barrier layers) used between a thermal layer and a semiconductor die and/or the die-attach.

According to one embodiment, a semiconductor device includes a semiconductor die and a planar thermal layer. In certain embodiments, the coefficient of thermal expansion (CTE) of the thermal layer is more than the CTE of the die. The semiconductor device includes a thick-silver layer having a thickness of at least four (4) micrometers disposed on a first planar side of the planar thermal layer. A metallurgical die-attach is disposed between the thick-silver layer and the die, with the metallurgical die-attach directly contacting the thick-silver layer.

In another embodiment, a method of manufacturing a semiconductor device includes disposing a thick-silver layer directly onto a first planar side of a planar thermal layer, the thick-silver layer having a thickness of at least (four) 4 micrometers. The method also includes disposing a metallurgical die-attach between the thick-silver layer and a die, with the metallurgical die-attach directly contacting the thick-silver layer.

In another embodiment, a semiconductor device includes a semiconductor die having a gallium nitride (GaN) layer and a substrate comprising silicon (Si), silicon carbide (SiC), or diamond. The semiconductor device also includes a copper planar thermal layer constructed from Cu-151 or Cu-102. The semiconductor device also includes a thick-silver layer at least four (4) micrometers thick disposed directly onto a first planar side of the copper planar thermal layer and a metallurgical die-attach disposed between the thick-silver layer and the die, the metallurgical die-attach directly contacting the thick-silver layer and coupling the die to the thick-silver layer. The metallurgical die-attach is a silver sinter die-attach or a gold-tin (AuSn) die-attach.

Figure 1:
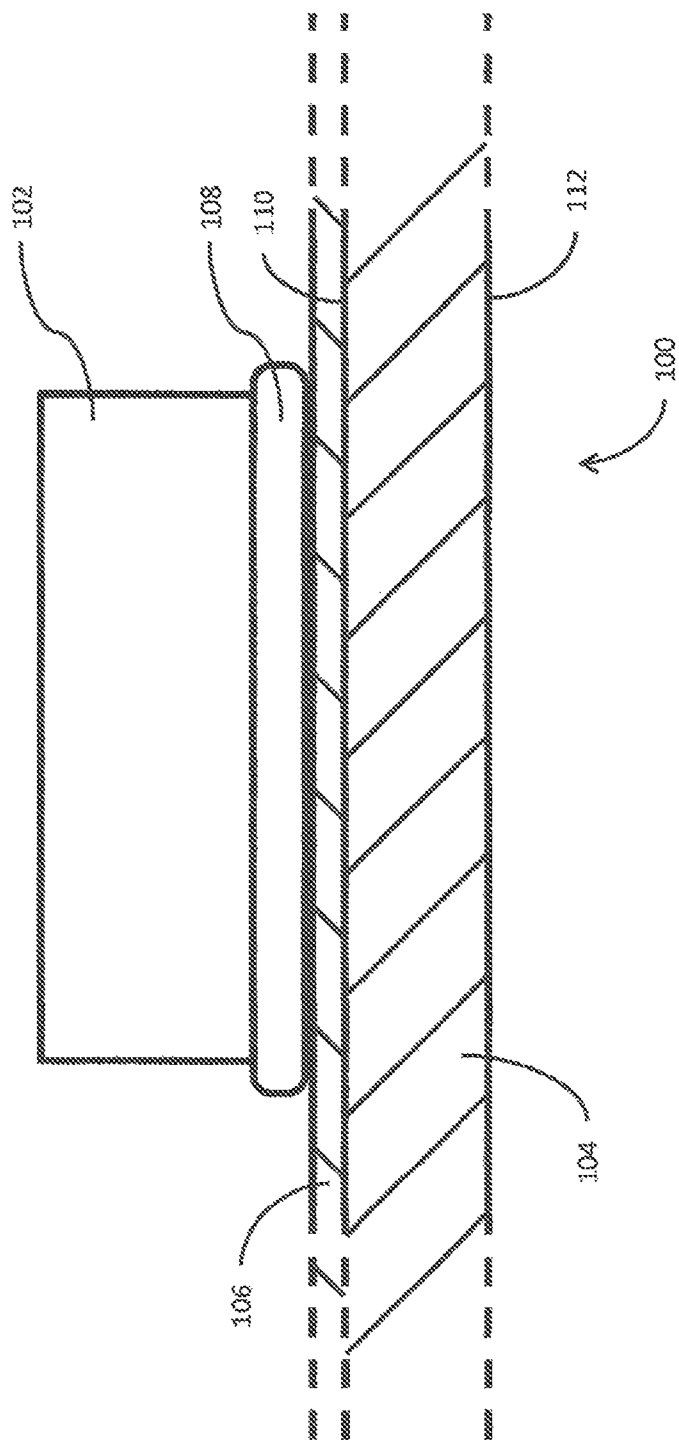
FIG. 1 is a diagram of a semiconductor device in accordance with various embodiments of the present disclosure.

Referring now to the figures, FIG. 1 shows a diagram of a semiconductor device 100 in accordance with various embodiments. The diagram is a side-view of the semiconductor device 100 and includes a cut-away view of various portions thereof. The semiconductor device 100 includes a die 102, a thermal layer 104, a thick-silver layer 106, and a die-attach 108. The thick-silver layer 106 is disposed on the thermal layer 104. The die 102 is coupled to the thick-silver layer 106 (and thus to the thermal layer 104) via the die-attach 108. Such an arrangement allows for dissipation of heat generated by the semiconductor die 102 through the die-attach 108 and thick-silver layer 106 to the thermal layer 104, where the heat can in-turn be transferred to the surrounding air or other structures (e.g., larger structures or structures designed to further dissipate heat). In various embodiments, silver is used for the thick-silver layer 106 (as opposed to other materials) because silver conducts heat between the die 102 and the thermal layer 104 while also providing a stress-decoupling layer due to its relatively high ductility as compared to other materials. Further, silver does not exhibit high amounts of strain hardening or work hardening which allows silver to maintain its ductility over time. These properties lower the stresses in the die attach 108 and the die 102, thereby improving the overall reliability of the product as contrasted with other materials.

Figure 3:
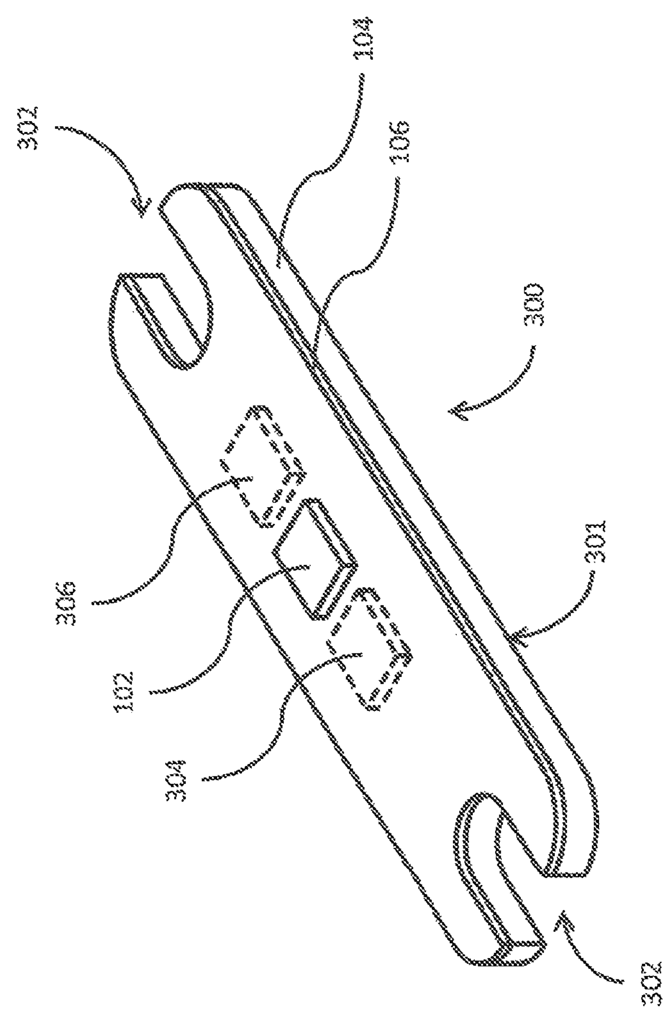
FIG. 3 is a perspective view of a semiconductor device in accordance with various embodiments of the present disclosure.

The thermal layer 104 can be of any suitable thickness or dimension according to the physical shape or heat-dissipation needs of the particular application. In one example, and with brief reference to FIG. 3, the thermal layer is a flange 301 to which the die 102 is attached. The flange 301 may include cutouts 302 or other suitable features that allow it to be attached to a structure, such as to a circuit board or to a structural frame. Returning to FIG. 1, in one embodiment, the thermal layer 104 is planar (e.g., substantially flat), though other shapes, profiles, and landscapes are possible. The entirety of the thermal layer 104 may be planar (as is shown in FIG. 3). Alternatively, various portions or segments of the thermal layer 104 may be planar while other portions or segments may include bends, steps, curves, or other features. A thermal layer 104 may include slight bends or curves on its surface while still remaining planar (so as to account for variances, tolerances, or even slight intended curve features). In one approach, the thermal layer 104 includes at least a planar portion (e.g., a substantially flat portion) at one or more locations at which one or more dies 102 will be attached to accommodate the typically flat surfaces of the underside of die 102. The thermal layer 104 may be constructed from a singular entity (such as a single piece of metal), or may be assembled from multiple independent entities.

In one approach, the thermal layer 104 is formed of copper or a copper-alloy to form a copper thermal layer. In one example, the thermal layer 104 is formed of Cu-151, while in another example the thermal layer 104 is formed of Cu-102. These copper-alloys have relatively high thermal conductivity (e.g., between about 350 W/mK (Watts per meter Kelvin) and 400 W/mK) as compared to other copper-alloys, making them relatively good at dissipating heat. Other coppers and copper-alloys may be suitable in various application settings, including copper-tungsten (CuW) or copper-molybdenum (Cu/Mo). However, these particular copper-alloys (CuW and Cu/Mo) have thermal conductivities in the range of 150-240 W/mK, which is less than the above-mentioned Cu-151 and Cu-102 varieties. Additionally, in other approaches, the thermal layer 104 may be constructed from non-copper materials. For example, aluminum-silicon-carbide (AlSiC) can be used, however, it also has a lower thermal conductivity (170-200 W/mK) than the above-mentioned Cu-151 and Cu-102 varieties. In other approaches, the thermal layer 104 may be constructed from silver or silver-alloys, or other metallic or non-metallic materials capable of dissipating heat.

Various embodiments of the present disclosure use coppers and copper-alloys (and other materials) that have higher thermal conductivities for the thermal layer 104, which in-turn results in improved heat dissipation. This allows for higher current-throughput devices or higher frequency devices, which generate higher heat loads. However, as mentioned above, materials with higher thermal conductivities often have a correspondingly higher CTE. For example, Cu-102 or Cu-151 may have a CTE of around 16.0-18.0 ppm/° C. In a typical semiconductor device, as the device heats up, the thermal layer 104 will expand at a rate corresponding to its CTE. The die 102 and die attach 108 will also expand typically (with a CTE approximately between 1.0 ppm/° C. and 7.5 ppm/° C. depending up on the material used), but a problem can occur if the difference between the CTE of the thermal layer 104 and the die 102 and/or die attach 108 is too great.

The difference in CTEs can result in the introduction of physical stresses to the semiconductor device 100 as the semiconductor device 100 heats up during use or when the semiconductor device 100 is passed through reflow during assembly or when incorporated onto a circuit board, with a higher heat load resulting in greater physical stress. For example, while the device heats up, if the thermal layer 104 expands faster than the die 102 or die-attach 108, then sheer forces at the joint between the die-attach 108 and the thermal layer 104 may cause the joint to fail or break, potentially causing the semiconductor device 100 to fail. In a different scenario, the die 102 or layers therein (such as gallium-nitrate (GaN) layers) may break or crack due to the physical stresses, also causing the semiconductor device 100 to fail. Some solutions may use materials for the thermal layer 104 that have a CTE closer to the CTE of the die and/or die-attach (e.g., CuW, Cu/Mo, or AlSiC, having CTE of around 6.0-10.0 ppm/° C.). However, this is typically at the expense of decreased thermal conductivity and similarly decreased heat dissipation capabilities, as discussed above.

Other solutions have accommodated higher thermal conductivity copper thermal layers by introducing a plurality of layers of various materials between the copper thermal layer and the die-attach. For example, some solutions utilize a ductile layer, but also require the use of a barrier layer (typically Ni or NiCo) as well as an additional gold (Au) layer on top of the barrier layer to avoid diffusion of portions of the ductile layer and the barrier layer into the die-attach. Such diffusion is undesirable as it may diminish the strength of the joints between the die and die-attach, and between the die-attach and the thermal layer. The additional barrier layer (Ni or NiCo) is typically harder than the ductile layer and can add stress back into the system, thus counteracting the stress-buffering effect of the ductile layer. Further, these solutions involve added costs and complexity due to multiple procedures required to dispose multiple layers of material onto the thermal layer. No previous solution involved the use of or thick-silver layer 106 with the die-attach 108 directly contacting the thick-silver layer 106 in the absence of other layers of materials. In certain embodiments of the present disclosure, the use of silver (Ag) sinter, gold-tin (AuSn), epoxy die-attach 108, or other silver-compatible die-attach materials allows the use of the thick-silver layer 106 to the exclusion of the other layers of buffer materials because diffusion of silver into these die-attach materials does not significantly affect their strength, if at all. So configured, by using a single material as the buffer layer (e.g., silver) without the additional other layers, costs and complexity are reduced and sourcing of material can be made easier.

With continued reference to FIG. 1, according to various embodiments, a thick-silver layer 106 is disposed or formed directly onto a first planar side 110 of the thermal layer 104. The thick-silver layer 106 may be disposed directly onto a first planar side 110 of the thermal layer 104 by electroplating, or other suitable deposition or formation methods. In one embodiment, the thick-silver layer 106 is disposed onto the first planar side 110 and not onto the second planar side 112. In another embodiment shown in FIG. 2, a thick-silver layer 106 is also disposed onto the second planar side 112. Thick-silver layer 106 is formed with sufficient thickness to provide adequate stress decoupling between the thermal layer 104 and the die 102 to reduce or eliminate cracking of the die 102 and/or the die attach 108 or other failures at high temperatures. In experimentation and testing, it has been shown that the thick-silver layer 106 should have a thickness of at least approximately four (4) micrometers in order to provide sufficient stress decoupling. If thick-silver layer 106 were to be narrower (e.g., two (2) micrometers or less), the layer would fail to provide adequate stress decoupling. Therefore, in various embodiments, the thick-silver layer 106 has a thickness of at least approximately between four (4) micrometers and six (6) micrometers. In at least another embodiment, the thick-silver layer 106 has a thickness of at least approximately between seven (7) and eight (8) micrometers, with approximately 7.5 micrometers being determined advantageous in at least one embodiment. The thick-silver layer 106 may be thicker than the thicknesses described herein. There is no actual upper bound to the thickness of the thick-silver layer 106, however cost and design requirements will typically dictate an upper bound to the thickness of the thick-silver layer 106. The described thickness of the thick-silver layer 106 applies primarily to an area beneath a die 102, though the entirety of the planar surface 110 may include the thick-silver layer 106 of the same or similar thickness. The thicknesses described herein are subject to normal tolerances and variations that would be expected during manufacturing, as would be understood by a person of ordinary skill in the art of semiconductor manufacturing and/or design.

A die-attach 108 is disposed between the thick-silver layer 106 and the die 102. By one approach, the die-attach 108 directly contacts the thick-silver layer 106. For example, and contrary to previous solutions, the semiconductor device 100 does not include an additional layer of material (e.g., NiCo, Au, or the like) between the die-attach 102 and the thick-silver layer 106. In one embodiment, the die-attach 102 is a metallurgical die-attach, while in other embodiments, the die-attach 102 is a non-metal variety, including, for example, thermal epoxy. In one embodiment, the die-attach 108 is metallurgical and consists of a silver (Ag) sinter or a gold-tin (AuSn) die-attach. In using such materials, diffusion of silver (Ag) from the thick-silver layer 106 or copper (Cu) from the thermal layer 104 into the die-attach 108 during the attachment process (e.g., due to the heat of the process, for example, approximately 300° C. for gold-tin and approximately 250° C. for silver-sinter) will have little impact on the strength of the joints between the die-attach 108 and the thick-silver layer 106 or the die 102. This is due, in part, to the fact that the reflow temperature is lower for these die-attach materials than other varieties, thereby reducing the diffusion.

Other die-attach 108 materials may be considered. For example, gold-silicon (AuSi) die-attach may be utilized (requiring a heat of up to 400° C. during the attachment process). However, the strength of the gold-silicon die-attach may be diminished from the diffusion of copper into the gold-silicon die-attach. As such, previous solutions required the use of the barrier layers such as NiCo to inhibit diffusion of copper into the gold-silicon die-attach. Nickel prevents diffusion of copper into the die attach 108, and the cobalt (Co) in the NiCo layer prevents diffusion of nickel into the die attach 108 (which can oxidize and prevent attachment of the die 102 to the die attach). The use of the above-mentioned silver-sinter or gold-tin die-attach materials can be beneficial in that they eliminate the requirement for the additional barrier layers (e.g., NiCo, which is hard and can introduce stresses) without diminishing the strength of the die-attach joints.

In various embodiments, the die 102 includes a silicon (Si) substrate or a silicon carbide (SiC) substrate. In other embodiments, the die 102 may include other substrate materials instead of or in addition to those described above, including a substrate of or including diamond, gallium nitride (GaN), gallium arsenide (GaAs), or other suitable substrate materials. Typical die sizes are as small as 60 mils by 60 mils to as large as 500 mils by 500 mils, though other die-sizes are possible.

Figure 2:
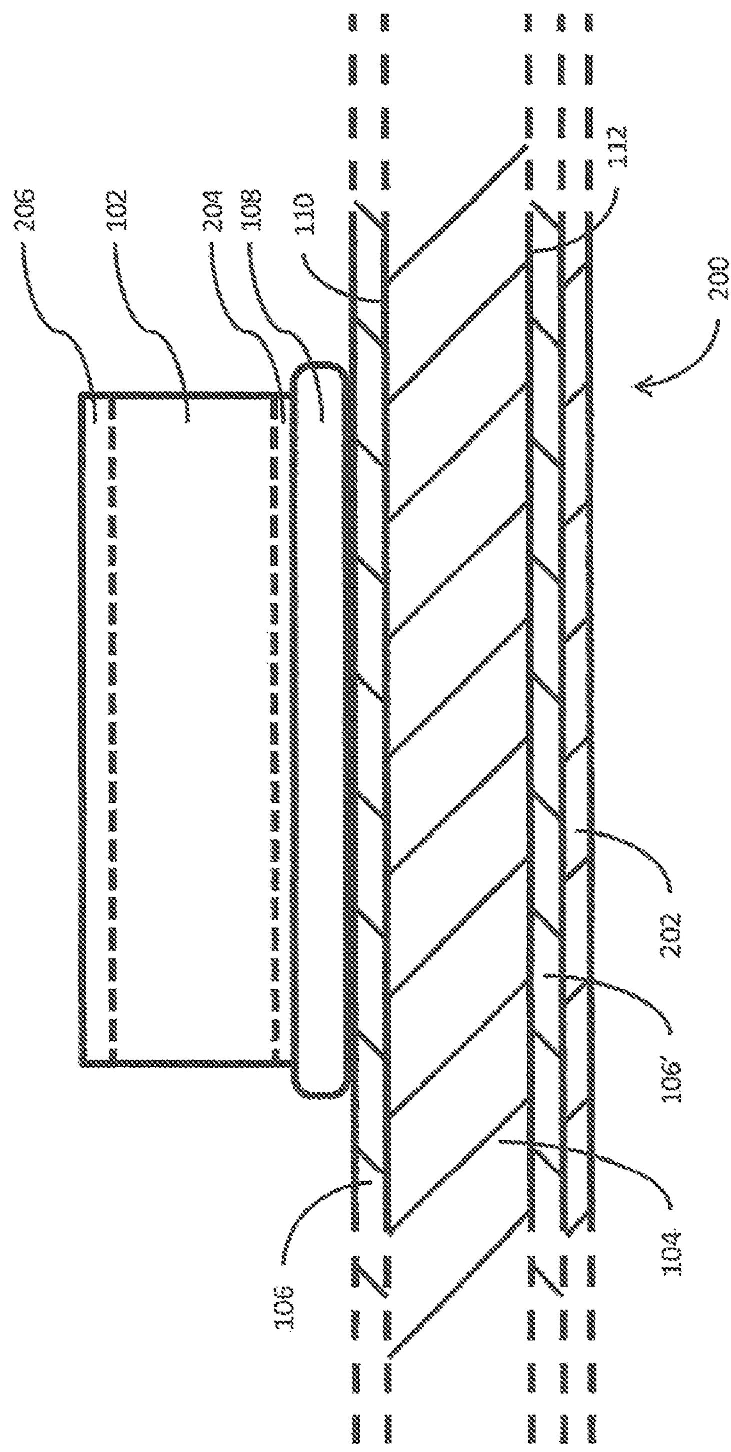
FIG. 2 is a diagram illustrating details of and variations to the semiconductor device of FIG. 1 in accordance with various embodiments of the present disclosure.

FIG. 2 illustrates various details and/or alternatives to the semiconductor device 200 illustrated in FIG. 1. In one embodiment, the die 102 includes a layer of material 206 that is different than that of the substrate material of the die. In one embodiment, this layer 206 is disposed on a top surface of the substrate. For example, the layer 206 may be a gallium nitride (GaN) layer, possibly comprising a GaN-based semiconductor circuit. Gallium nitride (GaN) has such benefits as high dielectric strength, high operating temperature, high current density, high speed switching, and low on-resistance. This makes GaN a particularly beneficial material for use in power circuits, high-frequency applications (e.g., radio-frequency applications), as well as other specific and general applications. However, a GaN layer 206 can be more susceptible to stresses of a CTE mismatch between the die 102 and the thermal layer 104, which can cause the GaN layer 206 to shift electrical performances and characteristics under the stress. Further, a Si or SiC substrate of a die 102 may not be able to withstand a CTE mismatch caused by higher operating temperatures capable with GaN, which may result in cracks in the die 102. Thus, the thick-silver layer 106 not only operates to reduce stresses in the solder joints of the die-attach 108, but also to reduce stresses to the die 102, as well as preserving electrical performance of the GaN layer 206.

With continued reference to FIG. 2, other aspects of the semiconductor device 200 are described in accordance with various embodiments. In one embodiment, the die 102 includes a layer 204 of gold (Au) or silver (Ag) disposed onto the underside of the die 102, the underside being the side of the die 102 that is closest to the thermal layer 104 and makes contact (directly or through the layer 204) with the die attach 108. This layer 204 may help ensure a strong bond between the die 102 and the die-attach 108.

In another embodiment, the semiconductor device 200 may include a barrier layer 202 disposed onto a second planar side 112 of the thermal layer 104. The barrier layer 202 may be disposed onto a thick-silver layer 106' that may be disposed directly onto the thermal layer 104 (as shown in FIG. 2), or the barrier layer 202 may be disposed directly onto the second planar side 112 in the absence of such a thick-silver layer 106' (e.g., where the thick-silver layer 106 is plated only onto the first planar side 110 of the thermal layer 104). The barrier layer 202 may include a single layer or multiple layers of various materials. For example, in one approach, if the semiconductor device 200 is an air-cavity semiconductor device, the barrier layer 202 may include nickel/palladium/gold (Ni/Pd/Au), which provides adequate protection from oxygen while providing a suitable solderable coupling. In another approach, if the semiconductor device 200 is an over-mold semiconductor device, the barrier layer 202 may include a copper (Cu) flash, nickel (Ni), nickel/gold (Ni/Au), tin (Sn), or nickel/tin (Ni/Sn), which materials provide adequate solderable coupling without the need for protection from oxygen due to the air-tight nature of the over-mold construction. Other materials may also be suitable for the barrier layer 202 in various application settings.

Turning now to FIG. 3, an example semiconductor device 300 is illustrated in accordance with at least one embodiment. Here, the thermal layer 104 is illustrated as a flange 301 (e.g., a copper flange) that includes the thick-silver layer 106 deposited thereupon. The flange 301 may include one or more cut-outs 302 or other features to facilitate coupling to a circuit board or the like. The die 102 is coupled to the thick-silver layer 106 of the flange 301 with a die-attach 108 as described above. One or more additional dies 304, 306 may also be attached in a same or similar manner to the flange 301 in various embodiments. Dies 304, 306 may be the same as, or different from, die 102 or each other, and may operate with, or independent of, the die 102 or each other. In one embodiment, an over-mold (not shown) may be dispersed and/or molded over the dies 102, 304, 306 and all or part of the flange 301. Leads (not shown) may also be included to allow electrical communication with or between the dies 102, 304, 306.

Figure 4:
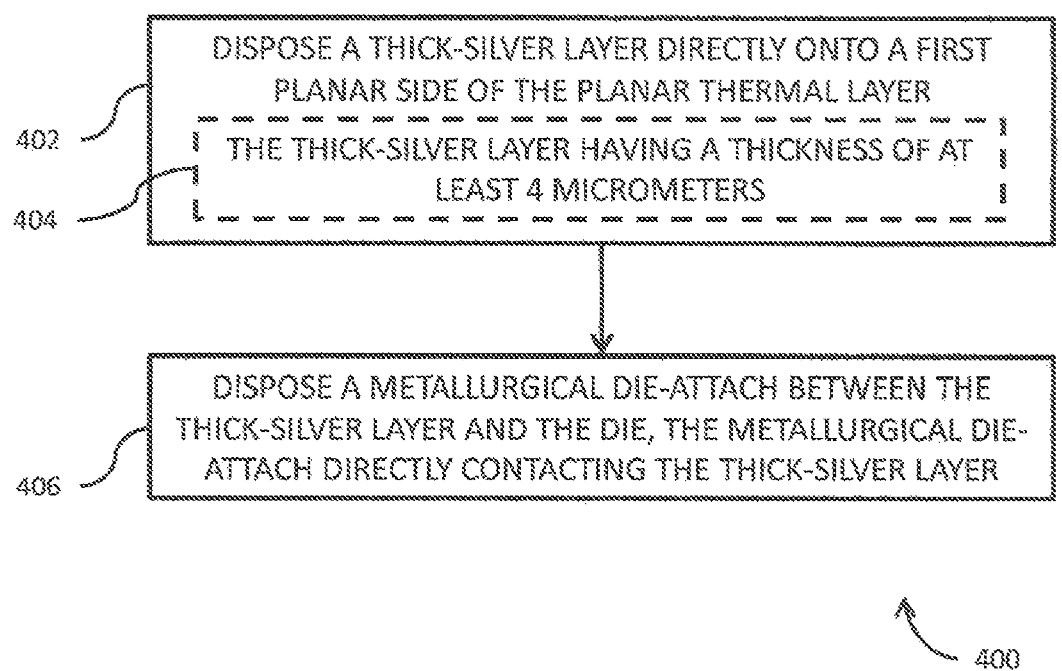
FIG. 4 is a flow diagram of a method of manufacturing a semiconductor device in accordance with various embodiments of the present disclosure.

Turning now to FIG. 4, a method 400 of manufacturing a semiconductor device 100, 200, or 300 is illustrated in accordance with various embodiments. The method 400 includes disposing a thick-silver layer 106 directly onto a first planar side 110 of a thermal layer 104 at step 402. In one embodiment, the thick-silver layer 106 has a thickness of at least four (4) micrometers as is illustrated at 404. The thermal layer may be a planar thermal layer 104 in some embodiments. At step 406, the method 400 includes disposing a metallurgical die-attach 108 between the thick-silver layer 106 and a die 102, the metallurgical die-attach 108 directly contacting the thick-silver layer 106. In certain embodiments, the die 102 has a CTE less than the CTE of the thermal layer 104, though in other embodiments, the die 102 may have a CTE equal to or greater than the CTE of the thermal layer 104. In other embodiments, the planar thermal layer has a CTE that is at least two-and-a-half times the CTE of the die 102.

The method 400 may also include providing the die 102 including a gallium nitride (GaN) layer 206 and/or a silicon (Si) substrate or silicon carbide (SiC) substrate. The method 400 may also include disposing a silver (Ag) sinter die-attach or a gold-tin (AuSn) die attach between the thick-silver layer 106 and the die 102. In further embodiments, the method 400 may include electro-plating the thick-silver layer 106 directly onto a first planar side 110 of the planar thermal layer 104. The method 400 may also include providing a planar thermal layer 102 comprising Cu-151 or Cu-102. In other embodiments, the method 400 includes disposing (directly or indirectly) a barrier layer 202 on a second planar side 112 of the thermal layer 104, the barrier layer including copper (Cu) flash, nickel (Ni), nickel/gold (Ni/Au), tin (Sn), nickel/tin (Ni/Sn), or nickel/palladium/gold (Ni/Pd/Au). The method 400 may also include disposing a layer 204 of gold (Au) or silver (Ag) onto the underside of the die 102.

The described semiconductor device 100, 200, and 300 can operate at normal and extended operating temperatures (e.g., a GaN die could reach up to and possibly beyond 250° C., while the flange 301 may reach up to and possibly beyond 125° C.) while being able to withstand CTE mismatches between the die 102 and the thermal layer 104. Particularly, the semiconductor device 100, 200, and 300 will be able to operate when the die 102 has a CTE that is less than the CTE of the thermal layer 104. For example, the semiconductor device 100, 200, and 300 will be able to operate when the thermal layer 104 has a CTE that is at least two-and-a-half times the value of the CTE of the die 102. For example, a silicon-carbide (SiC) die, having a CTE of approximately 4 ppm/° C., with a GaN layer 206, having a CTE of approximately 5 ppm/° C., may be used with a copper thermal layer (e.g., Cu-151 or Cu-102), having a CTE of approximately 17 ppm/° C. (17 ppm/° C. being over four-times as much as 4 ppm/° C. and over three-times as much as 5 ppm/° C.). In other approaches, the semiconductor device 100, 200, and 300 will be able to operate when the thermal layer 104 has a CTE that is at least two times, three times, or four times (or more) the value of the CTE of the die 102.

So configured, a new solution is disclosed to accommodate substantial CTE mismatches between a semiconductor die 102 and a corresponding thermal layer 104 that eliminates previously-required barrier layers there between, thus reducing stresses in the semiconductor device 100, 200, and 300 while simultaneously reducing cost and complexity of the device 100, 200, and 300.

The flow chart diagrams included are generally set forth as logical flow-chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow-chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

The present invention has been described in terms of one or more preferred embodiments, and it should be appreciated that many equivalents, alternatives, variations, and modifications, aside from those expressly stated, are possible and within the scope of the invention.

We claim:

1. A method of manufacturing a semiconductor device, the method comprising:

disposing a thick-silver layer directly onto a first planar side of a planar thermal layer, wherein the planar thermal layer has a coefficient of thermal expansion (CTE) that is more than a CTE of a die, and wherein the thick-silver layer has a thickness of at least four (4) micrometers, and the planar thermal layer including a copper thermal layer; and disposing a metallurgical die-attach between the thick-silver layer and the die, the metallurgical die-attach directly contacting the thick-silver layer and coupling the die to the thick-silver layer, wherein the metallurgical die-attach includes a silver sinter die attach.

2. The method of claim 1, wherein the planar thermal layer has a coefficient of thermal expansion (CTE) that is at least two-and-a-half times a CTE of the die.

3. The method of claim 1, including providing the planar thermal layer and providing the die.

4. The method of claim 1, wherein the die includes a silicon (Si) substrate, a silicon carbide (SiC) substrate, or a diamond substrate.

5. The method of claim 1, including disposing a silver (Ag) sinter die-attach or a gold-tin (AuSn) die-attach between the thick-silver layer and the die.

6. The method of claim 1, wherein disposing the thick-silver layer includes electro-plating the thick-silver layer directly onto a first planar side of the planar thermal layer.

7. The method of claim 1, including disposing gold (Au) or silver (Ag) onto an underside of the die.

8. The method of claim 1, wherein the planar thermal layer has a CTE that is at least two-and-a-half times the CTE of the die.

9. The method of claim 1, wherein the thick-silver layer is disposed onto the first planar side of the planar thermal layer by electro-plating.

10. The method of claim 1, including disposing gold (Au) or silver (Ag) onto an underside of the die.

11. A method of manufacturing a semiconductor device, the method comprising:

disposing a thick-silver layer directly onto a first planar side of a planar thermal layer, the thick-silver layer having a thickness of at least four (4) micrometers;

disposing a metallurgical die-attach between the thick-silver layer and a die, the metallurgical die-attach directly contacting the thick-silver layer; and disposing a barrier layer on a second planar side of the planar thermal layer, the barrier layer including copper (Cu), nickel (Ni), nickel/gold (Ni/Au), tin (Sn), nickel/tin (Ni/Sn), or nickel/palladium/gold (Ni/Pd/Au).

12. The method of claim 11, wherein the planar thermal layer includes copper.

13. A method of manufacturing a semiconductor device, the method comprising:

disposing a thick-silver layer directly onto a first planar side of a planar thermal layer, the thick-silver layer having a thickness of at least four (4) micrometers, and the planal thermal layer including a copper thermal layer;

disposing a metallurgical die-attach between the thick-silver layer and a die, the metallurgical die-attach directly contacting the thick-silver layer and coupling the die to the thick-silver layer, wherein the metallurgical die-attach includes a silver sinter die attach; and disposing a barrier layer onto a second planar side of the planar thermal layer, wherein the barrier layer includes copper (Cu), nickel (Ni), nickel/gold (Ni/Au), tin (Sn), nickel/tin (Ni/Sn), or nickel/palladium/gold (Ni/Pd/Au).

14. A method of manufacturing a semiconductor device, the method comprising:

disposing a thick-silver layer having a thickness of at least four (4) micrometers directly onto a first planar side of a copper planar thermal layer; and disposing a metallurgical die-attach between the thick-silver layer and a die, the metallurgical die-attach directly contacting the thick-silver layer and coupling the die to the thick-silver layer, wherein the metallurgical die-attach includes a silver sinter die-attach or a gold-tin (AuSn) die-attach, and wherein the die includes a gallium nitride (GaN) layer and a substrate including silicon (Si), silicon carbide (SiC), or diamond.

15. The method of claim 14, wherein the copper planar thermal layer has a coefficient of thermal expansion (CTE) that is at least two-and-a-half times a CTE of the die.

16. The method of claim 14, wherein the copper planar thermal layer includes at least one of Cu-151 and Cu-102.

17. The method of claim 14, wherein the thick-silver layer is disposed onto the first planar side of the copper planar thermal layer by electro-plating.

18. The method of claim 14, including disposing gold (Au) or silver (Ag) onto an underside of the die.

19. A method of manufacturing a semiconductor device, the method comprising:

disposing a thick-silver layer having a thickness of at least four (4) micrometers directly onto a first planar side of a copper planar thermal layer;

disposing a metallurgical die-attach between the thick-silver layer and a die, the metallurgical die-attach directly contacting the thick-silver layer and coupling the die to the thick-silver layer, wherein the metallurgical die-attach includes a silver sinter die-attach or a gold-tin (AuSn) die-attach; and disposing a barrier layer onto a second planar side of the copper planar thermal layer, the barrier layer including copper (Cu), nickel (Ni), nickel/gold (Ni/Au), tin (Sn), nickel/tin (Ni/Sn), or nickel/palladium/gold (Ni/Pd/Au).

* * * * *